United States Patent [19]
Adan

[11] Patent Number: 5,244,823
[45] Date of Patent: Sep. 14, 1993

[54] PROCESS FOR FABRICATING A SEMICONDUCTOR DEVICE

[75] Inventor: Alberto O. Adan, Tenri, Japan

[73] Assignee: Sharp Kabushiki Kaisha, Osaka, Japan

[21] Appl. No.: 958,451

[22] Filed: Oct. 7, 1992

Related U.S. Application Data

[63] Continuation of Ser. No. 745,341, Aug. 15, 1991, abandoned.

[30] Foreign Application Priority Data

May 21, 1991 [JP] Japan ................... 1-16155

[51] Int. Cl.$^5$ ............................................. H01L 21/70
[52] U.S. Cl. ........................................ 437/41; 437/40; 437/44
[58] Field of Search ........................... 437/40, 41, 44; 257/336, 344, 408, 900

[56] References Cited

U.S. PATENT DOCUMENTS

| | | | |
|---|---|---|---|
| 3,867,197 | 2/1975 | Richman | 437/45 |
| 3,895,966 | 7/1975 | MacDougall et al. | 437/45 |
| 3,912,545 | 10/1975 | Armstrong | 437/45 |
| 4,033,797 | 7/1977 | Dill et al. | 437/45 |
| 4,052,229 | 10/1977 | Pashley | 437/44 |
| 4,173,818 | 11/1979 | Bassous et al. | 357/23.3 |
| 4,356,623 | 11/1982 | Hunter | 357/23.3 |
| 4,369,072 | 1/1983 | Bakeman, Jr. et al. | 437/44 |
| 4,597,824 | 7/1986 | Shinada et al. | 437/164 |
| 4,729,001 | 3/1988 | Haskell | 357/23.3 |
| 4,735,914 | 4/1988 | Hendrickson | 437/44 |
| 4,808,544 | 2/1989 | Matsui | 437/44 |
| 4,845,047 | 7/1989 | Holloway et al. | 437/45 |
| 4,994,404 | 2/1991 | Sheng et al. | 357/23.2 |
| 5,015,595 | 5/1991 | Wollesen | 437/44 |
| 5,015,598 | 5/1991 | Verhaar | 437/44 |

FOREIGN PATENT DOCUMENTS

| | | |
|---|---|---|
| 0073623 | 3/1983 | European Pat. Off. |
| 0083447 | 7/1983 | European Pat. Off. |
| 0051216 | 3/1987 | Japan |
| 0128175 | 6/1987 | Japan |
| 0136022 | 6/1987 | Japan |
| 0177441 | 7/1990 | Japan |

OTHER PUBLICATIONS

International Electron Devices Meeting 1985 Washington, D.C. Dec. 1–4, 1985 pp. 230–233; Christopher F. Codella et al.: "Halo Doping Effects in Submicron DI-ODD Device Design".

IEEE Electron Device Letters, vol. 11, No. 6, Jun. 1990, New York pp. 253–255; James R. Pfiester et al.: "A Selective Deposited Poly-Gate ITLDD Process with Self-Aligned LDD/Channel Implantation".

IBM Technical Disclosure Bulletin, vol. 22, No. 6, Nov. 1979, New York R. C. Varshney "Double Polysilicon Depletion-Model MOS Transistor Structure".

*Primary Examiner*—Tom Thomas
*Attorney, Agent, or Firm*—Nixon & Vanderhye

[57] ABSTRACT

A process for fabricating a semiconductor device having a non-uniformly and lightly doped channel comprising the steps of forming on a Si substrate an isolation region of a field oxide and an active region of a thin $SiO_2$ layer; performing first channel doping by implanting first conductivity type ions; after removing said thin $SiO_2$ layer, forming a gate oxide dielectric and a gate electrode thereon; performing a second channel doping by implanting said type ions; depositing a thin polysilicon layer; depositing a $SiO_2$ layer on said thin polysilicon layer; etching to remove a portion of said $SiO_2$ layer and thin polysilicon layer to form a side wall; and implanting second conductivity type ions followed by heat treatment to provide source and drain regions.

5 Claims, 2 Drawing Sheets

PROCESS FOR FABRICATING A SEMICONDUCTOR DEVICE

This is a continuation of application Ser. No. 07/745,341, filed Aug. 15, 1991, now abandoned.

BACKGROUND OF THE INVENTION

1. Field of the Invention

The present invention relates to a process for fabricating a semiconductor device and, more particularly to a process for fabricating a Metal Oxide Semiconductor Field Effect Transistor (called hereunder, MOSFET)- having a submicron channel length.

2. Description of the Prior Art

Recently, MOS transistors have been rapidly scaled down, involving shortened channel lengths thereof. This results in severe degradation of electrical characteristics of MOS transistors due to threshold voltage lowering and mobility degradation when the channel length becomes comparable to the source and drain regions depletion layer width. These effects are known as "short-channel degradation", and are a serious limitation for further device scaling.

Some approaches for overcoming the above effects are known. One of these approaches adopts the so-called "halo" or "pocket" deep implantation to provide highly doped regions 23 and 24 near the respective junctions of source 21 and drain 22 of a MOS transistor 20, as shown in FIG. 2 (C. F. Codella and S Ogura, "Halo doping effects in submicron DI-LDD device design", IEDM Tech. Dig. (1985), 230). However, the depth and lateral spread of this implantation may be limited in sub-half micrometer channel length transistors, and in addition, a higher doping concentration at the drain junction increases the junction parasitic capacitance, degrading device speed.

Another approach uses oblique rotating ion implantation to form a non-uniformly doped channel of a MOS transistor 30, as shown in FIG. 3 (Y. Okumura, et al.: "A Novel Source-to-Drain Nonuniformly doped Channel (NUDC) MOSFET for high current drivability and threshold voltage controllability", IEDM Tech. Dig. (1990), 391). According to this technique, the doping concentration is higher near the source and drain, which reduces the widening of the depletion region, and at the same time, the doping concentration in the middle of the channel is reduced to improve the carrier mobility. The limitation of this technique is that in order to penetrate about ⅓ of the channel length, a relatively large implantation angle (Q) and a relatively high energy are required. This results in: [i) higher concentration at the drain junction, degrading device speed; and (ii) difficult control of the channel middle region width, especially in sub-half micrometer devices.

SUMMARY OF THE INVENTION

The present invention is accomplished to overcome the foregoing problems of the prior art methods.

Thus, the present invention provides a process for fabricating a semiconductor device comprising the steps of:

(a) forming on a silicon substrate a field oxide to provide an isolation region and an active region, followed by forming a thin silicon oxide layer on said active region;

(b) performing a first channel doping by implanting first conductivity type ions using said thin silicon oxide layer as a screening layer;

(c) after removing said thin silicon oxide layer, forming a gate oxide dielectric and then a gate electrode thereon;

(d) performing a second channel doping by implanting said first conductivity type ions using said gate electrode as a mask;

(e) depositing a thin polysilicon layer on the entire surface;

(f) depositing a silicon oxide layer so as to cover said thin polysilicon layer;

(g) etching to remove said silicon oxide layer and said thin polysilicon layer sequentially but retaining a portion of them existing adjacent said gate electrode to form a side wall composed of a retained portion of said thin polysilicon layer and a retained portion of said silicon oxide layer, on opposite sides of said gate electrode; and (h) implanting second conductivity type ions using said side wall and said gate electrode as a mask, followed by heat treatment to provide source and drain regions.

DETAILED DESCRIPTION OF THE PREFERRED EMBODIMENTS

A preferred embodiment of the present invention will now be described in detail with reference to FIG. 1.

Figure 1:
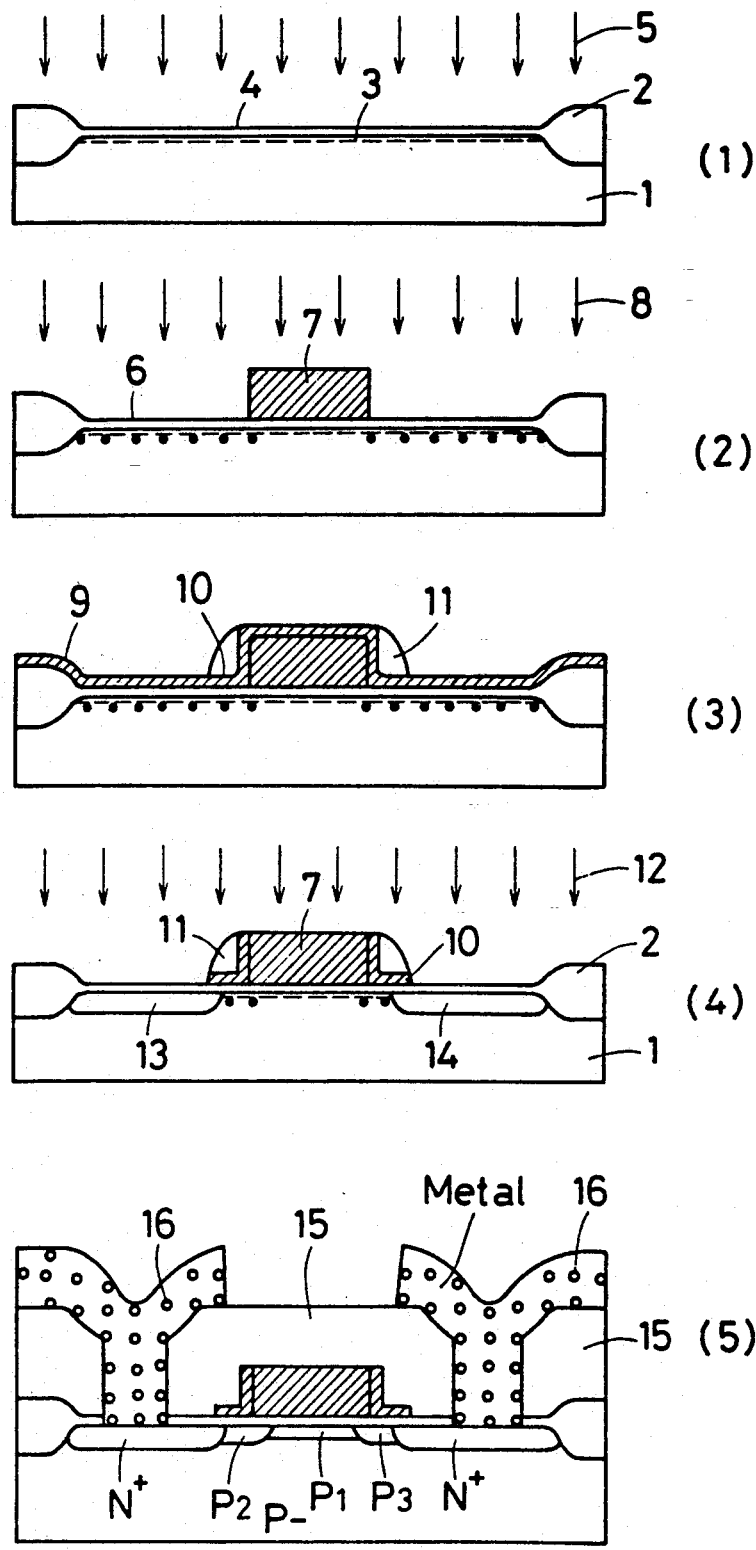
FIG. 1(1)–1(5) are views illustrating a process of the invention.
Figure 2:
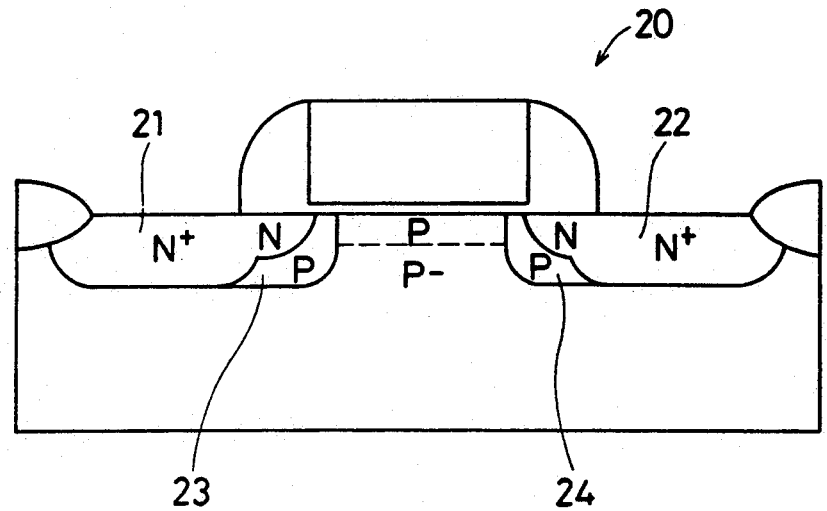
FIG. 2 is a view illustrating a structure of a prior art MOS transistor.
Figure 3:
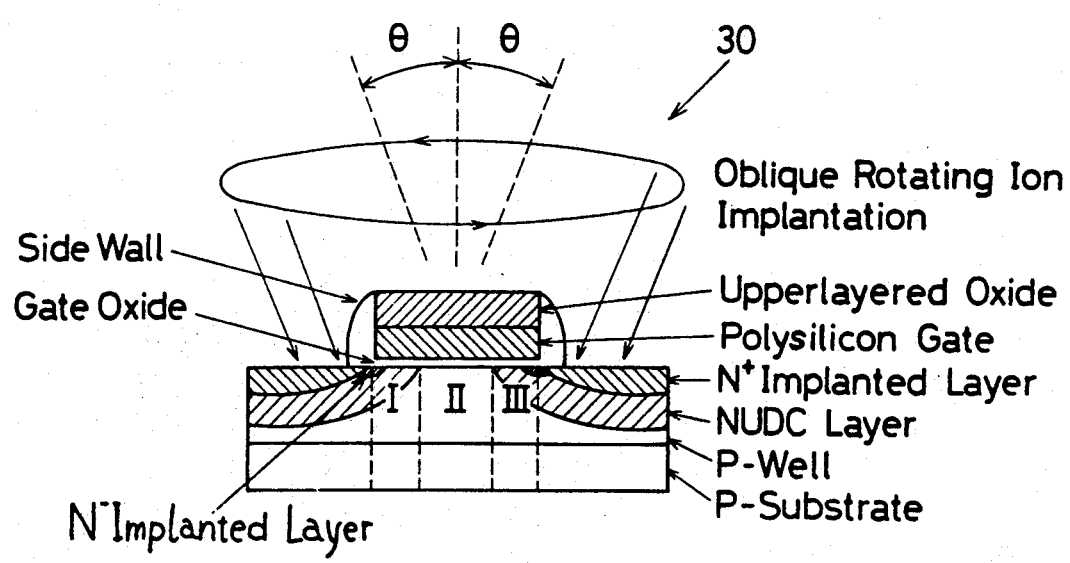
FIG. 3 is a view illustrating a structure of another prior art MOS transistor.

(a) Referring to FIG. 1(1), a field oxide 2 is first formed on a Si substrate 1 to provide an isolation region 2 and an active region 3. The field oxide 2 is formed to about 5000–6000 Å thick using the well-known LOCOS technique at a temperature, for example, 1050° C. in the presence of $H_2$ and $O_2$. Subsequently, a thin $SiO_2$ layer 4 is formed to about 200–300 Å thick over the active region 3 by thermal oxidation of silicon at, for example, 1050° C. in $O_2$ ambient, or a CVD process using, for example, $SiH_4$ and $O_2$, at 800°–850° C. and 0.5–2.0 Torr.

(b) A first channel doping is performed by implanting P-type ions 5 such as B ions or In ions into the Si substrate 1 using the thin $SiO_2$ layer 4 as a screening layer. The implantation is effected orthogonally to the substrate 1 but shallowly, thereby defining the doping depth and the impurity atoms concentration at the center of the channel ($P_1$ in FIG. 1(5)). Conditions for the implantation are selected depending on the characteristics of an intended device. Usually the acceleration energy is set to about 30–40 keV; the dosage is set to about $1-5 \times 10^{12} cm^{-2}$.

(c) The thin $SiO_2$ layer 4 is removed by, for example, wet etching (1% HF aqueous solution), and then as shown in FIG. 1(2), a gate oxide dielectric 6 is grown to a predetermined thickness by thermal oxidation. For example, in a 0.5 μm channel process, the gate oxide dielectric 6 is grown to about 100–130 Å thick by heating at about 900°–1000° C. for 0.5–1 hour.

Next, as shown in FIG. 1(2) a gate electrode 7 is formed in the following typical manner. A polysilicon layer is first deposited to about 1000–4000 Å thick by LPCVD process using, for example, SiH$_4$, at 600°–650° C. and 0.5 Torr; subsequently the polysilicon layer is doped with N-type ions such as phosphorus ions (acceleration energy: 60–80 keV; dosage: 10$^{15}$ cm$^{-2}$) so as to lower the resistance of the layer, and; the thus obtained polysilicon layer is patterned and etched by RIE technique (Cl$_2$+O$_2$+HBr, 20 mTorr) to form the gate electrode 7.

(d) Subsequently a second channel doping is performed by implanting P-type ions 8 such as B ions or In ions (acceleration energy: 30–40 keV, dosage: 10$^{12}$–10$^{13}$ cm$^{-2}$), using the gate electrode 7 as a mask. The second channel doping together with the first channel doping defines the doping depth and the impurity atoms concentration at the extremes of the channel (P$_2$ and P$_3$ of FIG. 1(5)). The doping depth and the impurity atoms concentration can be optimized to reduce short-channel degradation.

(e) Referring to FIG. 1(3), a thin polysilicon layer 9 is deposited to about 200–500 Å thick by, for example, LPCVD process using SiH$_4$ or the like, at 600°–650° C. and about 0.5 Torr.

(f) On the thin polysilicon 9, a SiO$_2$ layer is deposited to about 1000–2000 Å thick by, for example, CVD process using SiH$_4$+O$_2$, at 800°–900° C.

(g) Referring to FIG. 1(4), the above SiO$_2$ layer and the polysilicon layer 9 are etched, while retaining a portion of them so as to form side walls on opposite sides of the gate electrode 7, the side walls consisting of gate electrode extensions 10 (the retained portion of the polysilicon layer 9) and the retained SiO$_2$ layer 11. The etching in this process may be performed as follows. First, the SiO$_2$ layer is etched by RIE technique (CHF$_3$+CF$_4$+Ar, 1 Torr) to form the retained SiO$_2$ layer 11 near the gate electrode 7. Subsequently the polysilicon layer 9 is etched by RIE technique (Cl$_2$+O$_2$+HBr, 20 mTorr) to form the gate electrode extensions 10.

(h) As shown in FIG. 1(4), implantation of N-type ions 12 is performed using the side walls and the gate electrode as a mask to form a source region 13 and a drain region 14, followed by heat treatment. In the implantation used are, for example, P ions or As ions as the N-type ions 12, with acceleration energy: 30–50 keV, dosage: 1–3×10$^{15}$ cm$^{-2}$. The heat treatment is performed at about 800°–850° C. for 0.5–1 hour.

(i) Referring to FIG. 1(5), another SiO$_2$ layer 15 as an isolation layer is deposited by, for example, CVD process, followed by heat treatment (850°–950° C. for 0.5–1 hour). Then, contact holes are formed and filled with a metal layer 16 to form devices interconnection according to well-known techniques.

According to the process of the invention, a MOS transistor structure shown in FIG. 1(4) is obtained. By the first and second channel dopings the central portion (P$_1$ of FIG. 1(5)) is lightly doped so as to enhance the mobility, while the extreme portions (P$_2$ and P$_3$ of FIG. 1(5)) of the channel are heavily doped, thereby reducing the depletion areas of the source 13 and the drain 14. Such a non-uniform doping is shallowly performed so that the parasitic drain junction capacitance will not increase unnecessarily, whereby the device speed does not lower. Thus, the process of the present invention makes it possible to fabricate MOS transistors with a higher yield and low cost in a simpler manner than the prior art methods.

EXAMPLE

A MOS transistor was fabricated according to the following process.

(a) A Si substrate was patterned with a resist and heated at 1000° C. for 2 hours under oxygen atmosphere to form an isolation region, which was constituted by a field oxide of about 6000 Å thick, and an active region. On the active region a thin SiO$_2$ layer was deposited to about 250 Å thick by CVD process using SiH$_4$+O$_2$ at 850° C.

(b) A first channel doping was performed by implanting B ions into the active region orthogonally to the substrate with acceleration energy: 30 keV, dosage: 10$^{12}$ cm$^{-2}$, using the thin SiO$_2$ layer as a screening layer.

(c) The thin SiO$_2$ layer was removed using 1% HF aqueous solution. Thereafter, a gate oxide dielectric was grown to 120 Å thick on the substrate by thermal oxidation (heating at 900° C. for 18 min under oxygen atmosphere).

Next, a polysilicon layer was deposited to 2500 Å thick over the gate oxide dielectric by LPCVD process using SiH$_4$ at 600°–650° C., 0.5 Torr. The polysilicon layer was implanted with phosphorus ions (acceleration energy: 70 keV, dosage: 10$^{15}$ cm$^{-2}$) to be become N type. The polysilicon layer thus obtained was patterned and etched by RIE technique (Cl$_2$+O$_2$+HBr, 20 mTorr) to form a gate electrode.

(d) A second channel doping was performed by implanting B ions orthogonally to the substrate (acceleration energy: 30 keV, dosage: 10$^{13}$ cm$^{-2}$), using the gate electrode as a mask.

(e) A thin polysilicon layer was deposited to 350 Å thick by LPCVD process using SiH$_4$ at 620° C., 0.5 Torr, to form a thin polysilicon layer.

(f) A SiO$_2$ layer was deposited to 1500 Å thick to cover the thin polysilicon layer by CVD process using SiH$_4$+O$_2$ at 850° C.

(g) The SiO$_2$ layer was etched but retained near the gate electrode by RIE technique (CHF$_3$+CF$_4$+Ar, 1 Torr), then the thin polysilicon layer was also etched but retained near the gate electrode by RIE technique (Cl$_2$+O$_2$+HBr, 20 mTorr) to form gate electrode extensions. Consequently side walls were formed.

(h) Arsenic ions were implanted (acceleration energy : 40 KeV, dosage : 3×10$^{15}$ cm$^{-1}$) to form the source and drain using the electrode and the side walls as a mask, followed by heat treatment at 800° C. for 1 hour.

(i) Another SiO$_2$ layer was deposited to 6000 Å thick by well-known process, followed by heat treatment at 900° C. for 0.5 hours. Contact holes were formed, then filled with metal to form devices interconnection.

Thus, a MOS transistor having a half-micrometer channel length was obtained, which exhibited satisfactory electrical characteristics.

According to the process of the invention, a non-uniformly and lightly doped channel was formed. This results in reduced degradation of transistor characteristics by short-channel effects, increased effective mobility and drive current, and no increase of the parasitic drain junction capacitance. Thus, a MOS transistor having a sub-half micrometer channel length can be fabricated in a simplified manner with a high yield.

While only certain preferred embodiments have been described in detail, as will be apparent with those familiar with the art, certain changes and modifications can be made without departing from the scope of the invention as defined by the following claims.

What is claimed is:

1. A process for fabricating a semiconductor device with a non-uniformly and lightly doped channel comprising the steps of:

(a) forming on a silicon substrate of a first conductivity type, a field oxide to provide an isolation region and an active region, followed by forming a thin silicon oxide layer, which is substantially thinner than said field oxide, on said active region;

(b) performing a first channel doping by implanting conductivity type ions which are the same conductivity type ions as those in the silicon substrate, using said thin silicon oxide layer as a screening layer;

(c) after removing said thin silicon oxide layer, forming a gate oxide dielectric and then a gate electrode thereon;

(d) performing a second channel doping by implanting said first conductivity type ions using said gate electrode as a mask;

(e) depositing a thin polysilicon layer, which is substantially thinner than said gate electrode on the entire surface;

(f) depositing a silicon oxide layer so as to cover said thin polysilicon layer;

(g) etching said silicon oxide layer to form a side wall at least on both sides of said gate electrode, and then etching said thin polysilicon layer with said side wall used as a mask to form gate electrode extensions adjacent to the gate electrode; and (h) implanting second conductivity type ions using said side wall, gate electrode and gate electrode extensions as a mask, followed by heat treatment to provide source and drain regions thereby forming a first channel portion of first conductivity type ions on said substrate corresponding to said gate electrode, forming a second channel portion having a higher concentration of impurity than the first channel portion on said substrate corresponding to said gate electrode extensions, and forming the source and drain region outside of the second channel portion.

2. A process of claim 1 wherein a non-uniformly and lightly doped channel is formed by performing said first channel doping and second channel doping using said first conductivity type ions.

3. A process of claim 2 wherein said first conductivity type ions are B ions or In ions.

4. A process of claim 1 wherein second conductivity type ions for providing said source and drain regions are P ions or As ions.

5. A process of claim 1 wherein the retained portion of said thin polysilicon layer is L-shaped.

* * * * *